US012767814B2

(12) United States Patent
Ishii et al.

(10) Patent No.: US 12,767,814 B2
(45) Date of Patent: Oct. 20, 2026

(54) METHOD FOR PRODUCING SHAPED OBJECT, METHOD FOR PRODUCING LIQUID EJECTION HEAD, AND LIQUID EJECTION HEAD

(71) Applicant: CANON KABUSHIKI KAISHA, Tokyo (JP)

(72) Inventors: Miho Ishii, Kanagawa (JP); Kazunari Ishizuka, Shizuoka (JP); Satoshi Tsutsui, Kanagawa (JP); Yohei Hamade, Tokyo (JP); Haruka Yamaji, Tokyo (JP); Hikaru Sugimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1008 days.

(21) Appl. No.: 18/047,304

(22) Filed: Oct. 18, 2022

(65) Prior Publication Data

US 2023/0131514 A1 Apr. 27, 2023

(30) Foreign Application Priority Data

Oct. 25, 2021 (JP) ................................ 2021-173839

(51) Int. Cl.
*C08L 63/00* (2006.01)
*B41J 2/14* (2006.01)
(Continued)

(52) U.S. Cl.
CPC ............. *C08L 63/00* (2013.01); *B41J 2/1433* (2013.01); *B41J 2/162* (2013.01); *B41J 2/1637* (2013.01); *G03F 7/029* (2013.01); *G03F 7/031* (2013.01)

(58) Field of Classification Search
CPC ......... C08L 63/00; B41J 2/1433; B41J 2/162; B41J 2/1637; B41J 2/1603; B41J 2/1631;
(Continued)

(56) References Cited

U.S. PATENT DOCUMENTS

| | | | |
|---|---|---|---|
| 7,550,252 | B2 | 6/2009 | Shimomura et al. |
| 8,481,249 | B2 | 7/2013 | Matsumoto et al. |

(Continued)

FOREIGN PATENT DOCUMENTS

| | | | |
|---|---|---|---|
| CN | 111825781 | A | 10/2020 |
| JP | 2007-249193 | A | 9/2007 |

(Continued)

OTHER PUBLICATIONS

Tanabe (Year: 2018).*

(Continued)

*Primary Examiner* — Caleen O Sullivan
(74) *Attorney, Agent, or Firm* — Venable LLP

(57) ABSTRACT

A method for producing a shaped object, the method comprising: laminating a photosensitive resin composition on an inorganic material layer of a substrate having the inorganic material layer on a surface thereof; performing a patterned exposure of the photosensitive resin composition using an i-line; and curing a pattern-exposed portion and removing an unexposed portion to form a shaped object in which a cured product of the photosensitive resin composition is formed on the substrate, wherein the photosensitive resin composition comprises an epoxy resin, at least one cationic polymerization initiator with a molar extinction coefficient in an i-line of less than 500 $L \cdot mol^{-1} \cdot cm^{-1}$ and at least one sensitizer with a molar extinction coefficient in an i-line of 500 $L \cdot mol^{-1} \cdot cm^{-1}$ or more.

17 Claims, 3 Drawing Sheets

(51) Int. Cl.
*B41J 2/16* (2006.01)
*G03F 7/029* (2006.01)
*G03F 7/031* (2006.01)

(58) Field of Classification Search
CPC ....... B41J 2/1639; B41J 2/1645; G03F 7/029; G03F 7/031; C08G 59/4071; C08G 59/688; C08G 59/3218; C08G 59/4064; C08G 59/687
USPC .......................................................... 430/319
See application file for complete search history.

(56) References Cited

U.S. PATENT DOCUMENTS

| | | | |
|---|---|---|---|
| 8,500,246 | B2 | 8/2013 | Park |
| 8,617,795 | B2 | 12/2013 | Senzaki et al. |
| 8,785,110 | B2 | 7/2014 | Kodoi et al. |
| 2020/0209742 | A1 | 7/2020 | Tsutsui et al. |
| 2021/0213738 | A1* | 7/2021 | Tsutsui .................. B41J 2/1631 |
| 2022/0274407 | A1 | 9/2022 | Tsutsui et al. |

FOREIGN PATENT DOCUMENTS

| | | | |
|---|---|---|---|
| JP | 2008-100514 | A | 5/2008 |
| JP | 2008-250200 | A | 10/2008 |
| JP | 2010-265366 | A | 11/2010 |
| JP | 2013-018272 | A | 1/2013 |
| JP | 2014-24215 | A | 2/2014 |
| JP | 2015-136823 | A | 7/2015 |
| JP | 2015-206933 | A | 11/2015 |
| JP | 2018-156056 | A | 10/2018 |
| JP | 2019-143033 | A | 8/2019 |

OTHER PUBLICATIONS

Ueno (Year: 2007).*
Nist Chemistry WebBook, 1-Naphthalenol (2025).
Nist Chemistry WebBook, 2,6-Dihydroxynaphthalene (2025).
Ishii et al., U.S. Appl. No. 17/813,704, filed Jul. 20, 2022.

* cited by examiner

METHOD FOR PRODUCING SHAPED OBJECT, METHOD FOR PRODUCING LIQUID EJECTION HEAD, AND LIQUID EJECTION HEAD

BACKGROUND OF THE INVENTION

Field of the Invention

The present disclosure relates to a method for producing a shaped object using a photosensitive resin composition, a method for producing a liquid discharge head, and a liquid discharge head.

Description of the Related Art

Currently, photosensitive resin compositions are widely used in fields such as coatings, inks, and electronic materials. Since the polymerization of photosensitive resin compositions is polymerized by active light such as ultraviolet rays and visible light, such compositions excel in that the polymerization is faster than that of a thermosetting resin, and the amount of organic solvent used can be significantly reduced, so that working environment can be improved and load on environment can be reduced. Further, it is possible to form a fine structure by using a photolithography technique, and one example thereof is application to a liquid discharge head.

For example, Japanese Patent Publication Application No. 2013-018272 discloses a method for producing a recording head, the method including developing an discharge port-forming layer, a shape-stabilizing layer, and a channel side wall-forming layer using a photosensitive resin. U.S. Pat. No. 8,500,246 discloses a method for forming channel walls by laminating a dry film, composed of a photosensitive resin, on a surface on which an opening of a feeding port of a substrate is disposed, and processing the dry film.

SUMMARY OF THE INVENTION

In a step for forming a fine structure of a member of a liquid discharge head or the like, a photosensitive resin layer as an organic material is laminated on a substrate having an inorganic material layer and processed by photolithography in some cases. In this case, the adhesiveness between the substrate surface and the photosensitive resin layer tends to be lower than in the case where organic material layers are joined together. When uncured portions are removed by the development from a photosensitive resin layer on which a fine structure pattern is exposed, long-term treatment of a photosensitive resin layer with a developing solution may be required in some cases. The study by the present inventors has revealed that insufficient adhesiveness between the substrate and the photosensitive resin layer in such cases likely causes a separation therebetween.

In Japanese Patent Publication Application No. 2013-018272, at least three photosensitive resin layers are laminated on a substrate, a target fine structure pattern is then exposed to these three layers, and thereafter, a batch development is performed. Therefore, a sufficiently long development time may be required in some cases. In such cases, high curability is required for a photosensitive resin composition. In addition, in order to improve a manufacturing yield rate, sufficient adhesiveness to the substrate is required for a photosensitive resin layer in contact with the substrate.

Meanwhile, a dry film is laminated on a substrate surface on which an opening is formed, and then processed in U.S. Pat. No. 8,500,246, as described above. In such a case, sufficient adhesiveness between the dry film and the substrate and curability enough to suppress the deformation and film falling into the opening of a feeding port are required.

The present disclosure discloses a production method of a shaped object using a photosensitive resin composition with firm adhesiveness to a substrate having an inorganic material layer and high curability, as well as a production method of a liquid discharge head, and a liquid discharge head.

The present disclosure relates to a method for producing a shaped object, the method comprising:

laminating a photosensitive resin composition on an inorganic material layer of a substrate having the inorganic material layer on a surface thereof;

performing a patterned exposure of the photosensitive resin composition using an i-line; and curing a pattern-exposed portion and removing an unexposed portion to form a shaped object in which a cured product of the photosensitive resin composition is formed on the substrate, wherein the photosensitive resin composition comprises an epoxy resin, at least one cationic polymerization initiator with a molar extinction coefficient in an i-line of less than 500 $L \cdot mol^{-1} \cdot cm^{-1}$ and at least one sensitizer with a molar extinction coefficient in an i-line of 500 $L \cdot mol^{-1} \cdot cm^{-1}$ or more.

The present disclosure can provide a method for producing a shaped object using a photosensitive resin composition with firm adhesiveness to a substrate having an inorganic material layer and high curability.

Further features of the present invention will become apparent from the following description of exemplary embodiments with reference to the attached drawings.

DESCRIPTION OF THE EMBODIMENTS

Figure 1A:
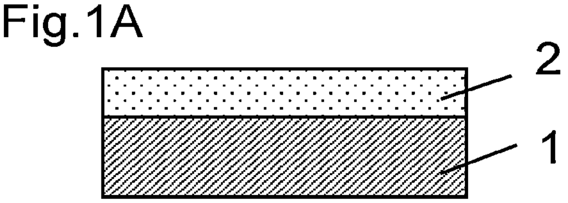
FIGS. 1A to 1C illustrates an example of a method for manufacturing a shaped product using a photosensitive resin composition.

In the present disclosure, the expression of "from XX to YY" or "XX to YY" indicating a numerical range means a numerical range including a lower limit and an upper limit which are end points, unless otherwise specified. Also, when a numerical range is described in a stepwise manner, the upper and lower limits of each numerical range can be arbitrarily combined.

When an example of a mode for carrying out the present disclosure is specifically described with reference to the drawings, the dimensions, materials, and shapes of the components disclosed in this mode and the relative positions thereof should be changed, as appropriate, depending on the constitution of members and various conditions to which the present disclosure is applied. That is, it is not intended that the scope of this disclosure is limited to the modes described below.

Hereinafter, the shaped object will be described in detail. In some cases, an exposure device used for photolithography may emit an i-line (365 nm). In this case, a photosensitive resin composition comprising an epoxy resin and a cationic polymerization initiator having an absorption wavelength in the i-line functions as a suitable negative resist. As an approach for improving the resist film strength and adhesiveness to substrates, a method of increasing the addition amount of the cationic polymerization initiator to increase the reactivity at exposure is mentioned.

However, the i-line absorption of the photosensitive resin composition may become excessive as the amount of the cationic polymerization initiator increases, and the deep-portion curability decreases, which results in conversely reduced adhesiveness in some cases. In particular, when the film thickness of the resist film is large, the difference in exposure intensity between the upper and lower parts of the film becomes large, and the curability and the adhesiveness are more difficult to control.

The photosensitive resin composition according to the present disclosure comprises an epoxy resin, a cationic polymerization initiator with a molar extinction coefficient in the i-line of less than 500 $L \cdot mol^{-1} \cdot cm^{-1}$ and a sensitizer with a molar extinction coefficient in the i-line of 500 $L \cdot mol^{-1} \cdot cm^{-1}$ or more. Using a cationic polymerization initiator with weak i-line absorption can suppress the decrease of deep-portion curability due to the increased amount of the cationic polymerization initiator. Meanwhile, combinedly using a sensitizer with strong i-line absorption can minimize the i-line absorption of the photosensitive resin composition. Using such a photosensitive resin composition can provide a shaped object with excellent adhesiveness to substrates and excellent curability.

The photosensitive resin composition comprises an epoxy resin. The epoxy resin is preferably a cationically polymerized epoxy resin in consideration of the adhesion performance, mechanical strength, swelling resistance, reactivity as a photolithography material, resolution, and the like of the cured product.

More specific examples can include cationically polymerized epoxy resin such as at least one polyfunctional epoxy resin selected from the group consisting of an epoxy resin having an alicyclic skeleton, an epoxy resin having a bisphenol skeleton such as bisphenol A type or F type epoxy resin, an epoxy resin having a phenol-novolac skeleton such as a phenol-novolac epoxy resin, an epoxy resin having a cresol-novolak skeleton such as a cresol-novolak epoxy resin, an epoxy resin having a norbornene skeleton, an epoxy resin having a terpene skeleton, an epoxy resin having a dicyclopentadiene skeleton, an epoxy resin having an oxycyclohexane skeleton, and the like. These can be used alone or in combination of two or more.

An epoxy resin having two or more epoxy groups, that is, a bi- or higher functional epoxy resin is preferably used as the epoxy resin. As a result, the cured product is three-dimensionally crosslinked, and the desired curability can be obtained. It is more preferable to use a tri- or higher functional epoxy resin having three or more epoxy groups. Further, at least one of the bifunctional epoxy resins may be added to and used with a tri- or further functional epoxy resin. That is, it is preferable that the epoxy resin comprise a tri- or further functional epoxy resin and a bifunctional epoxy resin. As such an epoxy resin, a commercially available one can also be used.

When the epoxy resin contains a tri- or higher functional epoxy resin and a bifunctional epoxy resin, the ratio of the bifunctional epoxy resin content to the tri- or higher functional epoxy resin content (bifunctional epoxy resin content/tri- or higher functional epoxy resin content) in the photosensitive resin composition on a mass basis is preferably 1/1 to 4/1 and more preferably 3/2 to 3/1.

Examples of commercially available tri- or higher functional epoxy resins include “157S70” and “jER1031S” (trade names) manufactured by Mitsubishi Chemical Corp., “EPICLON N695” and “EPICLON N-865” (trade names) manufactured by DIC Corporation, “CELLOXIDE 2021”, “GT-300 series”, “GT-400 series”, “EHPE3150” (trade names), manufactured by Daicel Corporation, “SU-8” (trade name) manufactured by Nippon Kayaku Co., Ltd., “VG3101” (trade name) and “EPDX-MKR1710” (trade name) manufactured by Printec Corporation, “Denacol Series” manufactured by Nagase ChemteX Corporation, and the like.

Examples of commercially available bifunctional epoxy resins include “jER1004”, “jER1007”, “jER1009”, “jER1009F”, “jER1010”, “jER1256” (trade names) manufactured by Mitsubishi Chemical Corp., “EPICLON 4050” and “EPICLON 7050” (trade names) manufactured by DIC Corporation, and the like.

The photosensitive resin composition comprises at least one cationic polymerization initiator with a molar extinction coefficient in the i-line of less than 500 $L \cdot mol^{-1} \cdot cm^{-1}$. It is preferable that the cationic polymerization initiator has a cationic moiety and an anionic moiety. The cationic polymerization initiator is preferably at least one selected from the group consisting of sulfonic acid compounds, diazomethane compounds, sulfonium salt compounds, iodonium salt compounds, disulfone-based compounds, and the like. From the viewpoint of reactivity at the time of i-line irradiation, at least one selected from the group consisting of sulfonium salt compounds and iodonium salt compounds is more preferable, and at least one selected from the group consisting of sulfonium salt compounds is further preferable. That is, it is preferable that the cation moiety include at least one selected from the group consisting of a sulfonium salt and an iodonium salt.

An onium salt compound preferably includes at least one selected from the group consisting of $SbF_6^-$, $AsF_6^-$, $PF_6^-$, $(Rf)_n$, $PF_6^-$ (Rf is a perfluoroalkyl group), $BF_4^-$, $B(C_6F_5)_4^-$ and the like as the anion moiety. From the viewpoint of adhesion to a substrate plate, in particular, polymerization initiators including an antimony-containing compound, that is, $SbF_6^-$ are more preferable. These can be used alone or in a combination of two or more. Commercially available cationic polymerization initiators can also be used.

Commercially available products include “ADEKA OPTOMER SP-170”, “ADEKA OPTOMER SP-172”, and “SP-150” (trade names) manufactured by Adeka Corporation, “CPI-410S”, “CPI-110A”, and “CPI-100P” (trade names) manufactured by San-Apro Ltd., “DTS-102”, “DTS-200”, “BBI-103”, and “BBI-102” (trade names) manufactured by Midori Kagaku Co., Ltd, “MPF”, “IBCF”, “TS-01”, and “TS-91” (trade names) manufactured by Sanwa Chemical Co., Ltd., “WPI-116” and “WPI-124” (trade names) manufactured by FUJIFILM Wako Chemicals Co., Ltd., “Omnicat 250” (trade name) manufactured by IGM Resins B. V., and the like.

It is preferable to use at least one selected from the group consisting of “CPI-410S”, “CPI-110A”, “DTS-102”, “DTS-200”, “ADEKA OPTOMER SP-172”, “Omnicat 250”, “WPI-116”, and “WPI-124”.

The molar extinction coefficient in the i-line of the cationic polymerization initiator is preferably 450 $L \cdot mol^{-1} \cdot cm^{-1}$ or less, more preferably 400 $L \cdot mol^{-1} \cdot cm^{-1}$ or less, and still more preferably 350 $L \cdot mol^{-1} \cdot cm^{-1}$ or less. Meanwhile, the lower limit is not particularly limited, and the molar extinction coefficient in the i-line of the cationic polymerization initiator is preferably 0 $L \cdot mol^{-1} \cdot cm^{-1}$ or more, more preferably 1 $L \cdot mol^{-1} \cdot cm^{-1}$ or more, and still more preferably 5 $L \cdot mol^{-1} \cdot cm^{-1}$ or more.

The molar extinction coefficient in the i-line of the cationic polymerization initiator may be measured by a UV-visible-infrared spectrophotometer (manufactured by JASCO Corporation). Specific procedures will be described below.

The cationic polymerization initiator content in the photosensitive resin composition is preferably within the range of 0.1 to 30.0 parts by mass, more preferably within the range of 0.5 to 20.0 parts by mass, and still more preferably within the range of 1.0 to 15.0 parts by mass in relation to 100 parts by mass of the solid matters of the epoxy resin from the viewpoint of the curability and the adhesiveness to substrates.

The photosensitive resin composition contains at least one sensitizer with a molar extinction coefficient in the i-line of 500 $L \cdot mol^{-1} \cdot cm^{-1}$ or more. A preferable sensitizer is a compound having a molar extinction coefficient in the i-line of 500 $L \cdot mol^{-1} \cdot cm^{-1}$ or more and providing a sensitizing effect to the cationic polymerization initiator when irradiated with i-line. Polycyclic aromatics, heterocycles, pigments, metal complexes, etc., cause energy transfer when irradiated with an i-line and can assist the reactivity of a cationic polymerization initiator with weak i-line absorption.

The molar extinction coefficient in the i-line of the sensitizer is preferably 2000 $L \cdot mol^{-1} \cdot cm^{-1}$ or more, more preferably 3000 $L \cdot mol^{-1} \cdot cm^{-1}$ or more, and still more preferably 5000 $L \cdot mol^{-1} \cdot cm^{-1}$ or more. Meanwhile, the upper limit is not particularly limited, and the molar extinction coefficient in the i-line of the sensitizer is preferably 20000 $L \cdot mol^{-1} \cdot cm^{-1}$ or less, more preferably 10000 $L \cdot mol^{-1} \cdot cm^{-1}$ or less, and still more preferably 9000 $L \cdot mol^{-1} \cdot cm^{-1}$ or less.

The molar extinction coefficient in the i-line of the sensitizer may be measured by a UV-visible-infrared spectrophotometer (manufactured by JASCO Corporation). Specific procedures will be described below.

Specifically, the sensitizer is preferably at least one selected from the group consisting of an anthracene derivative, an anthraquinone derivative, a thioxanthone derivative, a carbazole derivative, curcumin, and the like. The sensitizer is more preferably at least one selected from the group consisting of an anthracene derivative, an anthraquinone derivative, and a thioxanthone derivative.

An anthracene derivative is suitably used because there is no concern about yellowing and even small amounts of addition can be effective. A dialkoxyanthracene is particularly preferable because it is highly soluble in resins. Dibutoxyanthracene is more preferable.

The anthracene derivative includes at least one selected from the group consisting of the compounds represented by the following formula (1).

(1)

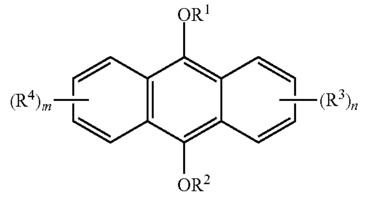

In the formula (1), $R^1$ and $R^2$ each independently represents an alkyl group having 1 or more carbon atoms (preferably from 1 to 18 carbon atoms, and more preferably from 1 to 12 carbon atoms, even more preferably from 4 to 8 carbon atoms) or an aryl group (preferably a phenyl group) having from 6 to 10 carbon atoms, $R^3$ and $R^4$ each independently represents an alkyl group (preferably having from 1 to 4 carbon atoms, and more preferably 1 or 2 carbon atoms), an alkoxy group having 1 or more carbon atoms (preferably from 1 to 18 carbon atoms, more preferably from 1 to 12 carbon atoms, even more preferably from 3 to 8 carbon atoms, and still more preferably from 4 to 6 carbon atoms), an amino group, an alkylamino group, an alkylsulfonyl group, or a halogen atom, and m and n each independently represents an integer of from 0 to 4 (preferably from 0 to 2, and more preferably 0 or 1). The number of carbon atoms in the alkyl chain of the alkylamino group and the alkylsulfonyl group is preferably from 1 to 4. It is preferable that $R^3$ and $R^4$ be each independently an alkyl group having from 1 to 4 carbon atoms (more preferably 1 or 2 carbon atoms), an alkoxy group having from 1 to 12 carbon atoms (more preferably from 3 to 8 carbon atoms, and still more preferably from 4 to 6 carbon atoms), or a chlorine atom.

Meanwhile, a compound that causes hydrogen abstraction or electron transfer by irradiation with i-line to produce radicals is also effective for assisting a cationic polymerization initiator. Specifically, an anthraquinone derivative and a thioxanthone derivative are mentioned as examples. When these sensitizers are used, it is highly effective to combinedly use a cationic polymerization initiator comprising iodonium salts, which has a high electron-accepting ability among onium salts. These may be used singly or in a combination of two or more of these.

Examples of anthraquinone derivatives include derivatives in which hydrogen atoms in anthraquinone are replaced with alkyl groups (preferably C1-4, more preferably C1-3) or alkoxy groups (preferably C1-4, more preferably C1-3).

Examples of thioxanthone derivatives include derivatives in which hydrogen atoms in thioxanthone are replaced with alkyl groups (preferably C1-4, more preferably C1-3) or alkoxy groups (preferably C1-4, more preferably C1-3). Other examples of thioxanthone derivatives include polymeric thioxanthone. For example, (2-carboxymethoxy thioxanthone)-(polytetramethyleneglycol 250) diester ("Omnipol TX", manufactured by IGM Resins) can be mentioned as one of the diesters of carboxymethoxy thioxanthone and polytetramethyleneglycols with various molecular weights.

Examples of commercially available sensitizers include "SP-100" (trade name), manufactured by ADEKA Corporation; "Curcumin", "2-Ethylanthraquinone", and "2-Isopropylthioxanthone" (trade names), all manufactured by FUJIFILM Wako Pure Chemical Corporation; "ANTHRACURE UVS-1331" and "ANTHRACURE UVS-1101" (trade names), both manufactured by AIR WATER PERFORMANCE CHEMICAL Inc.; and "Omnicat 250", "Omnipol TX", "Omnirad DETX" (trade names), manufactured by IGM Resins; and the like.

The content of the sensitizer in the photosensitive resin composition is preferably within the range of 0.1 to 30.0 parts by mass, more preferably within the range of 0.2 to 20.0 parts by mass, and still more preferably within the range of 0.5 to 15.0 parts by mass in relation to 100 parts by mass of the solid matters of the epoxy resin. This composition ratio provides the desired effect while maintaining a good resist pattern shape.

The content of the sensitizer in the photosensitive resin composition is preferably from 0.1 to 10 times, more preferably 0.2 to 5 times the content of the cationic polymerization initiator on a mass basis. This composition ratio provides the desired sensitizing effect to the cationic polymerization initiator and can form a better cured product.

The photosensitive resin composition may comprises an organic solvent. Organic solvents are not particularly limited and may be selected from various organic solvents known as coating solvents. Examples of organic solvents include ester compounds such as propylene glycol monomethyl ether acetate (PGMEA), xylene, and the like.

The content of the organic solvent in the photosensitive resin composition is preferably 20 to 500 parts by mass, more preferably 30 to 200 parts by mass in relation to 100 parts by mass of the solid matters of the epoxy resin.

In addition to the components shown above, the photosensitive resin composition can comprise a sensitizing aid, a basic substance such as an amine, an acid generator that generates weakly acidic (pKa=−1.5 to 3.0) toluenesulfonic acid, a silane coupling agent, and the like for the purpose of improving photolithographic performance, adhesion performance, and the like.

The photosensitive resin composition preferably comprises a sensitizing aid. Examples of the sensitizing aid include compounds that improve the energy conversion efficiency of light-absorbed anthracene derivatives. Examples of commercially available products include "ANTHRACURE UVS-2171" manufactured by Air Water Performance Chemical Inc. The amount of the sensitizing aid is not particularly limited but is preferably from 0.5 to 30 parts by mass, and more preferably from 1 to 10 parts by mass with respect to 100 parts by mass of the solid fraction of the epoxy resin.

The photosensitive resin composition preferably comprises a basic substance or an acid generator, and more preferably comprises an acid generator. An acid generator that generates weakly acidic (pKa=−1.5 to 3.0) toluenesulfonic acid is preferable. Examples of commercially available products include "TPS-1000" (trade name) manufactured by Midori Kagaku Co., Ltd. The amount of the acid generator is not particularly limited but is preferably from 0.5 10 parts by mass, and more preferably from 1 to 5 parts by mass with respect to 100 parts by mass of the solid fraction of the epoxy resin.

The photosensitive resin composition preferably comprises a silane coupling agent. Preferred examples thereof include a silane coupling agent having an epoxy group or a glycidyl group. Examples of commercially available products include "SILQUEST A-187" (trade name) manufactured by Momentive Performance Materials Inc. The amount of the silane coupling agent is not particularly limited but is preferably from 1 to 30 parts by mass, and more preferably from 5 to 15 parts by mass with respect to 100 parts by mass of the solid fraction of the epoxy resin.

The substrate having an inorganic material layer on the surface is not particularly limited as long as the surface on which the photosensitive resin composition is laminated comprises an inorganic material. The substrate may consist only of an inorganic material layer, or may have other layers (for example, organic material layers) other than inorganic material layers. The substrate having an inorganic material layer on the surface may be a substrate known as a substrate for a liquid discharge head. For example, a silicon substrate may be mentioned as an example.

Production of Shaped Object

The present disclosure provides a method for producing a shaped object using the photosensitive resin composition.

The method for producing a shaped object includes:

laminating a photosensitive resin composition on an inorganic material layer of a substrate having the inorganic material layer on a surface;

performing a patterned exposure of the photosensitive resin composition using i-line; and curing a pattern-exposed portion and removing an unexposed portion to form a shaped object in which a cured product of the photosensitive resin composition is formed on the substrate.

Figure 1B:
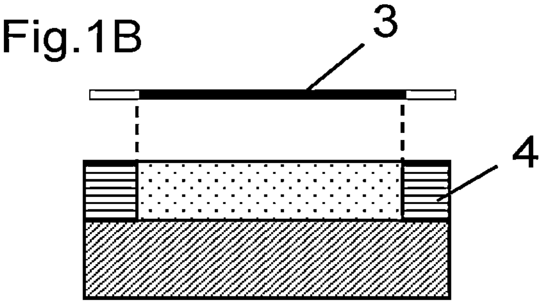
Figure 1C:
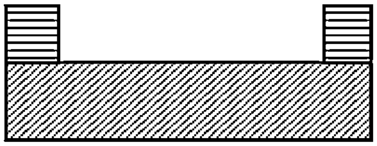

The following is an example of a method for manufacturing a shaped product using a photosensitive resin composition. A photosensitive resin composition 2 is laminated on a substrate 1 by coating or the like with a spin coating method, a slit coating method, or the like, and dried (FIG. 1A). Subsequently, the photosensitive resin composition (1) indicated by 2 is pattern-exposed with i-line radiation through a mask 3, and then the exposed portion is further cured by heat treatment (FIG. 1B). The mask 3 is obtained by forming a light-shielding film such as a chrome film according to a pattern on a substrate made of a material such as glass or quartz that transmits i-line radiation. As the exposure device, a projection exposure device having an i-line as a light source such as an i-line exposure stepper (trade name, manufactured by Canon Inc.) can be used. Then, by removing the unexposed portion of the photosensitive resin composition (1) indicated by 2 with a solvent such as PGMEA, a shaped product (cured product) 4 can be obtained on the substrate (FIG. 1C).

Application to Inkjet Recording Head

The shaped product can be exemplified by a liquid discharge head. That is, the method for manufacturing the liquid discharge head comprises above method for manufacturing the shaped product, and the photosensitive resin composition can be applied to a liquid discharge head. The liquid discharge head comprises, for example, a substrate having the inorganic material layer on a surface thereof, a flow path forming member disposed on the inorganic material layer of the substrate and forming a liquid flow path, and a discharge port forming member disposed on the flow path forming member and having a discharge port for discharging a liquid. The flow path forming member is a cured product of the photosensitive resin composition. The discharge port forming member may be a cured product of the photosensitive resin composition as well.

The thickness of the liquid discharge head or the shaped product in the direction perpendicular to the surface of the substrate on which the photosensitive resin composition is laminated may be determined, as appropriate, by the discharge design of the liquid discharge head or the design of the shaped product and is preferably from 3.0 to 25.0 μm.

As an example, a method for manufacturing an inkjet recording head, which is a form of a liquid discharge head, will be described hereinbelow. The scope of application of the shaped product is not limited to this. A method for manufacturing a liquid discharge head comprising at least a substrate having the inorganic material layer on a surface thereof, a flow path forming member that is provided on the inorganic material layer of the substrate and forms a liquid flow path, and a discharge port forming member that is provided on the flow path forming member and has a discharge port for discharging a liquid, the method for manufacturing comprising following steps at least: a step of laminating the photosensitive resin composition on the substrate, a step of pattern-exposing the photosensitive resin composition, and a step of curing an exposed portion that has been pattern-exposed, and then removing an unexposed portion to form the flow path forming member on the substrate, wherein the photosensitive resin composition is i-line irradiated in the pattern exposure step.

Figure 2A:
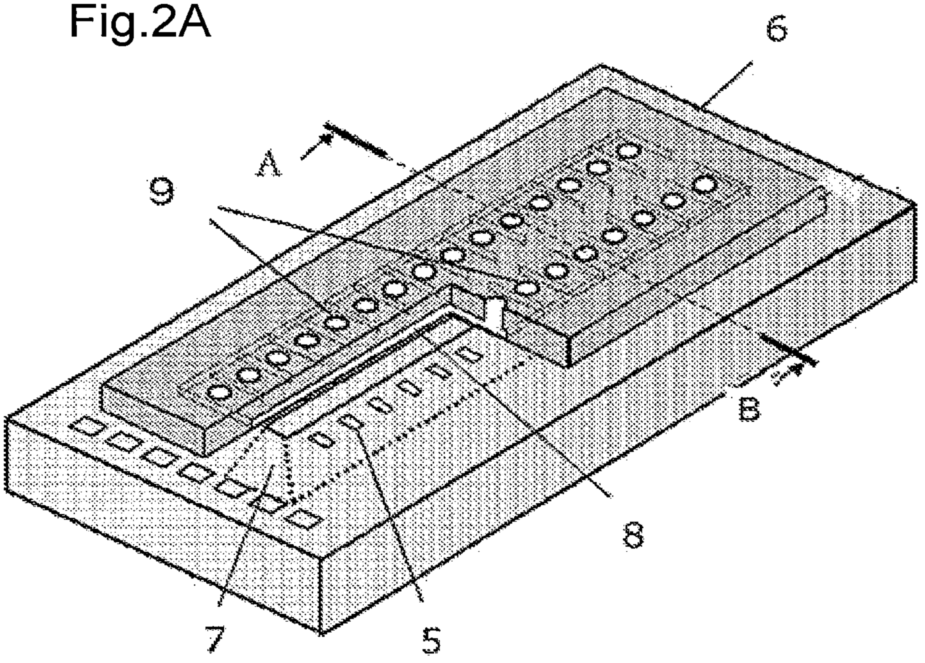
FIGS. 2A and 2B are schematic diagrams of an inkjet recording head using a photosensitive resin composition.

FIG. 2A is a schematic perspective view showing an example of an inkjet recording head obtained by applying the method for manufacturing a shaped product according to the present embodiment. Further, FIG. 2B is a schematic cross-sectional view showing a cross section of the inkjet recording head in A-B in FIG. 2A.

Figure 2B:
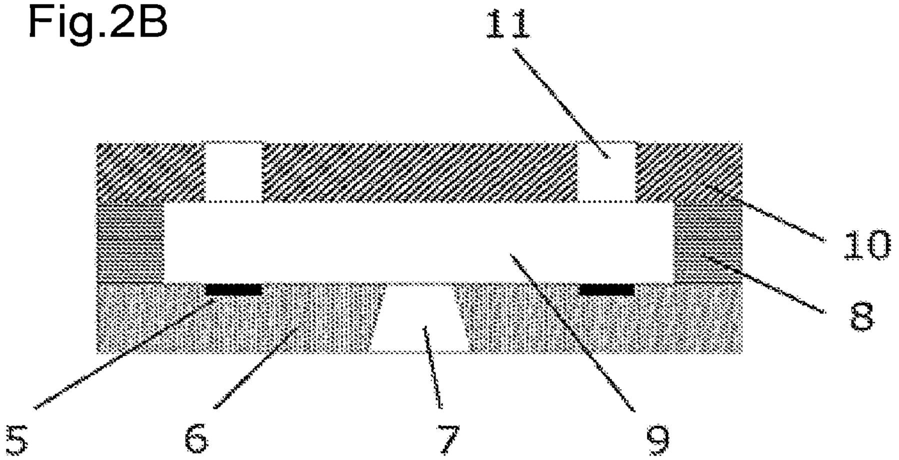

The inkjet recording head shown in FIGS. 2A and 2B has a substrate 6 in which energy generating elements 5 that generate energy to be used for discharging ink are arranged at a predetermined pitch. A supply unit 7 that supplies ink is opened in the substrate 6 between two rows of energy generating elements 5. An ink flow path 9 is formed on the substrate 6 by a flow path forming member 8. The flow path forming member 8 corresponds to the shaped products according to the present disclosure. Discharge ports 11 are formed in a discharge port forming member 10. Further, the discharge port forming member 10 can also correspond to the shaped products. The flow path forming member 8 and the discharge port forming member 10 may be integrated.

In the inkjet recording head shown in FIGS. 2A and 2B, energy generated by the energy generating elements 5 is given to the ink supplied from the supply unit 7 through the flow path 9, so that the ink is discharged as droplets through the discharge ports 11.

FIGS. 3A to 3H are schematic cross-sectional views showing an example of a method for manufacturing an inkjet recording head in which a shaped product according to the present embodiment is adopted.

Figure 3A:
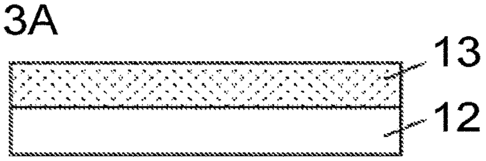
FIGS. 3A to 3H illustrates an example of a method for manufacturing an inkjet recording head using a photosensitive resin composition.
Figure 3B:
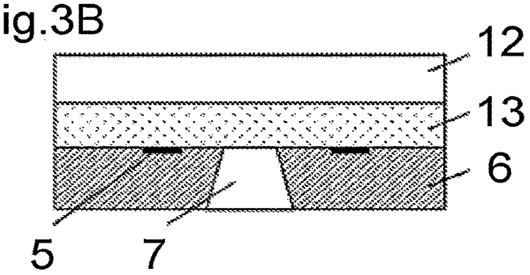
Figure 3C:
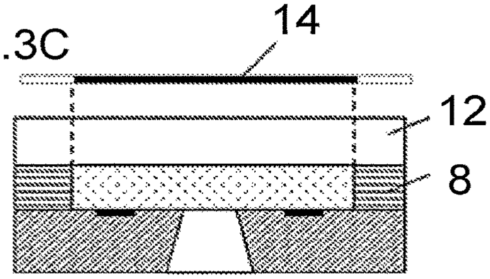
Figure 3D:
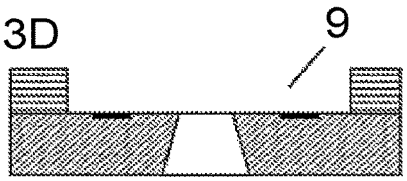

First, the photosensitive resin composition 13 according to the present disclosure is coated onto a PET film 12 by a spin coating method, a slit coating method, or the like, and dried by heating to produce a dry film (FIG. 3A). The obtained dry film is transferred onto the inorganic substrate 6 having the energy generating elements 5 and the ink supply unit 7 (FIG. 3B). The photosensitive resin composition 13 is pattern-exposed through a mask 14 having a flow path pattern, and further heat-treated to cure the exposed portion, and then the unexposed portion of the photosensitive resin composition 13 is removed with an organic solvent to form the flow path 9 (FIGS. 3C and 3D).

Figure 3E:
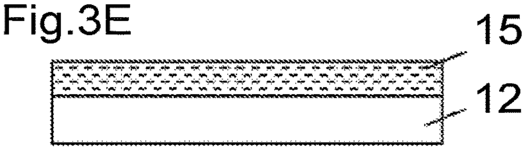
Figure 3F:
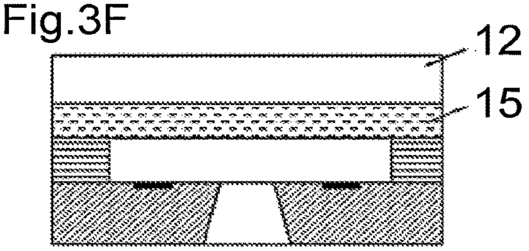
Figure 3G:
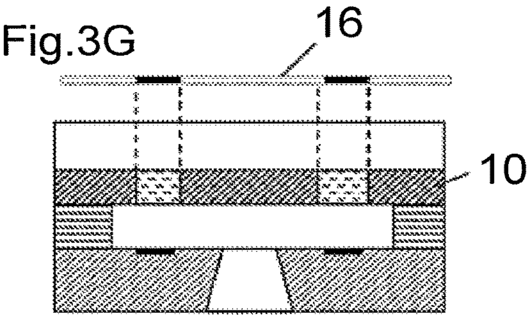
Figure 3H:
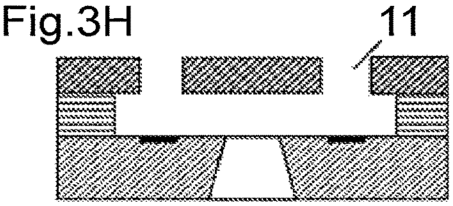

Subsequently, a photosensitive resin composition 15 is coated onto the PET film 12 and dried by heating to prepare a dry film, which is transferred onto the flow path forming member 8 (FIGS. 3E and 3F). The photosensitive resin composition 15 is pattern-exposed through a mask 16 having a discharge port pattern, and further heat-treated to cure the exposed portion, and then the unexposed portion of the photosensitive resin composition 15 is removed with an organic solvent to form the discharge ports 11 (FIGS. 3G and 3H). The masks 14 and 16 have a light-shielding film such as a chrome film formed on a substrate in accordance with a pattern of discharge ports or the like, the substrate being made of a material such as glass or quartz that transmits i-line radiation.

As the exposure device, a projection exposure device having an i-line light source such as an i-line exposure stepper (trade name, manufactured by Canon Inc.) can be used. The amount of exposure is not particularly limited and may be controlled, as appropriate, according to the photosensitive resin composition used. The exposure amount is, for example, preferably about from 500 to 20,000 J/$m^2$, and more preferably about from 5000 to 15,000 J/$m^2$.

The photosensitive resin composition 15 may be the above-mentioned photosensitive resin composition according to the present disclosure or may be another photosensitive resin composition.

By performing each of the above steps, it becomes possible to manufacture an inkjet recording head having excellent adhesion between the substrate 6 and the flow path forming member 8.

The molar extinction coefficient in the i-line is measured in the following manner. A target compound is dissolved in a solvent with no absorption in the i-line, such as acetonitrile, to prepare a solution. Then, the solution is put in a quartz cell, and the absorbance at 365 nm is measured using a UV-visible-infrared spectrophotometer (manufactured by JASCO Corporation). The molar extinction coefficient can be calculated according to the following formula from the obtained absorbance.

A Molar Extinction Coefficient=Absorbance÷Molar concentration of compound÷Optical path length of cell

EXAMPLES

The present invention is more specifically described herebelow using examples. The present invention is not limited by the examples that follow. The number of parts in the following formulations is on a mass basis in all instances unless specifically indicated otherwise.

Examples 1 to 29

Ingredients listed in Tables 1-5 were mixed to prepare photosensitive resin compositions (1) of Examples 1-29. Then, shaped objects were prepared on a substrate as described below, according to the steps illustrated in FIGS. 1A to 1C. The values for each ingredient in the tables denote parts (parts by mass). The names of products in the tables are as described in the text of the specification. In the tables, the unit of the molar extinction coefficients is $L \cdot mol^{-1} \cdot cm^{-1}$.

The photosensitive resin compositions (1) of Examples 1 to 29 were coated onto the substrate 1 by a spin coating method and dried by heat treating at 90° C. for 5 min (FIG. 1A). Subsequently, the photosensitive resin composition 2 was pattern-exposed through the mask 3 and further heat-treated to cure the exposed portion. Here, in the exposure machine, irradiation with light was performed at an exposure amount of 12,000 J/$m^2$ by using an i-line exposure stepper (manufactured by Canon Inc.) (FIG. 1B). Then, the unexposed portion of the photosensitive resin composition 2 was removed by PGMEA to form the shaped product 4 on the substrate (FIG. 1C). The thickness of the shaped product 4 was 10 μm.

Examples 30 to 32

An inkjet recording head was prepared according to the steps illustrated in FIGS. 3A to 3H. First, as shown in Table 8, a photosensitive resin composition (1) of Example 2, 12, or 29 was coated on a PET film 12 by a spin coating method and dried by heating at 90° C. for 5 minutes to prepare a dry film (FIG. 3A). The resultant dry film was transcribed on a silicon substrate 6 provided with an energy generating element 5 and a feeding portion 7 (FIG. 3B).

Subsequently, as shown in FIG. 3C, the photosensitive resin composition 13 was pattern-exposed through the mask 14 having a flow path pattern, and further heat-treated to cure the exposed portion. Here, in the exposure machine, irradiation with light was performed at an exposure amount of 12,000 J/m$^2$ by using the i-line exposure stepper (manufactured by Canon Inc.). Then, the unexposed portion of the photosensitive resin composition 13 was removed by PGMEA to form the flow path forming member 8 and the flow path 9 (FIG. 3D). The thickness of the flow path forming member 8 was 10 μm.

Then, the photosensitive resin composition (2) having the composition shown in Table 7 was coated onto the PET film 12 and dried by heat treating at 90° C. for 5 min to obtain a dry film 15 (FIG. 3E). The photosensitive resin composition (2) of each composition shown in Table 7 was used in the combinations shown in Table 8.

The obtained dry film 15 was transferred onto the flow path forming member 8. The dry film 15 was pattern-exposed through the mask 16 having a discharge port pattern and then heat-treated to cure the exposed portion. After that, the unexposed portion of the dry film 15 was removed by PGMEA to form the discharge port forming member 10 and the discharge ports 11, thereby producing an inkjet discharge head (FIGS. 3G and 3H). The exposure in FIG. 3G was performed at an exposure amount of 1100 J/m$^2$ using the same device as described above.

Comparative Examples 1 to 4

Shaped products were formed in the same manner as in Example 1, except that the compositions obtained by mixing the components shown in Table 6 were used as the photosensitive resin composition (1).

Comparative Examples 4 to 6

An inkjet discharge head was prepared in the same manner as example 30, except that the compositions listed in Table 8 as the photosensitive resin composition (1) were used.

Evaluation Method 1

Shaped objects prepared by the methods of Examples 1 to 29 and Comparative Examples 1 to 3 were evaluated for curability and adhesiveness to substrates. Regarding the curability, the film thickness of the shaped product before and after curing was measured, and the evaluation was performed in the following three stages on the basis of the amount of change.

Curability A: change rate is less than 3%

Curability B: change rate is 3% or more and less than 5%

Curability C: change rate is 5% or more

Meanwhile, the adhesiveness was tested by observing the presence or absence of a separation between a substrate and a shaped object after dipping the shaped object into a 20 mass % aqueous 1,2-hexanediol solution and storing the shaped product at 70° C.

Adhesiveness A: No separation was observed even after one week

Adhesiveness B: No separation was observed after 24 hours, but the separation was observed after 3 days Adhesiveness C: Separation was observed after 24 hours Evaluation Method 2

The print quality was evaluated using the inkjet discharge heads produced in Examples 30 to 32 and Comparative Examples 4 to 6. Using a Canon printer MB5330, a continuous printing test was performed in an environment of 30° C. and 80% RH, and the presence or absence of dot misdirection was visually checked. In the continuous printing test, 100 sheets with solid images on A4 paper were continuously printed. Here, A corresponds to a case where the print quality did not change and no misdirection occurred from the initial stage, B corresponds to a case where the print misdirection was less than 1%, and C corresponds to a case where the print misdirection was 1% or more.

The printing misdirection (%) was calculated as follows.

Print misdirection=(misdirection area/solid print area)×100

The misdirection area is the area of the portion that became blank due to the misdirection, and this area was observed with an electron microscope and visually determined.

Evaluation Result 1

As listed in Tables 1-5, shaped products with excellent curability and excellent adhesiveness to substrates could be provided in the methods according to the present embodiment. In particular, the results were good for both curability and adhesiveness in Examples 2 to 4, 7 to 9, and 11 to 29, in which the mixing amounts of the cationic polymerization initiator and the sensitizer are within the range of 0.1 to 30 parts by mass in relation to 100 parts by mass of the epoxy resin. Meanwhile, in Comparative Examples 1 and 2, the i-line absorption in the photosensitive resin composition became excess, and the deep-portion curability decreased. Therefore, a separation occurred, although the change in film thickness before and after the development was not observed. Furthermore, in Comparative Example 3, curing of the shaped object was insufficient, and the separation occurred after 24-hour storage.

Evaluation Result 2

Next, the evaluation results of the inkjet discharge heads will be described. In the method according to the Examples, it was possible to provide an inkjet discharge head having excellent discharge durability. In particular, in Example 32, no degradation of print quality was observed and good results were obtained even after 100 sheets printed with solid images. This is because the composition of Example 29 optimized for use in the inkjet discharge head was used as the photosensitive resin composition (1).

Specifically, the composition was such that the patterning accuracy was improved by the acid generator, and the adhesion to the substrate was improved by the silane coupling agent. Meanwhile, in the inkjet discharge heads of Comparative Examples 4 to 6 manufactured by the method according to the Comparative Examples, misdirection occurred after 100 sheets printed with solid images, and the discharge durability was insufficient.

TABLE 1

| Photosensitive resin composition (1) | | | | | | | | | | | | | |
|---|---|---|---|---|---|---|---|---|---|---|---|---|---|
| Ingredients | | Product name | Molar extinction coefficient (365 nm) | Examples 1 | 2 | 3 | 4 | 5 | 6 | 7 | 8 | 9 | 10 |
| Epoxy resin | Tri- or higher functional | EPICLON N695 | — | 100 | 100 | 100 | 100 | 100 | 100 | 100 | 100 | 100 | 100 |
| Cationic poly-merization initiator | $SbF_6^-$salt | CPI-110A | 64 | 0.05 | 3 | 10 | 30 | 40 | 3 | 3 | 3 | 3 | 3 |
| Additive | Anthracene derivative | UVS-1331 | 8634 | 3 | 3 | 3 | 3 | 3 | 0.05 | 3 | 10 | 30 | 40 |
| Solvent | | PGMEA | — | 150 | 150 | 150 | 150 | 150 | 150 | 150 | 150 | 150 | 150 |
| Curability | | | | B | A | A | A | A | B | A | A | A | A |
| Adhesiveness | | | | B | A | A | A | B | B | A | A | A | B |

TABLE 2

| Photosensitive resin composition (1) | | | | | | | |
|---|---|---|---|---|---|---|---|
| Ingredients | | Product name | Molar extinction coefficient (365 nm) | Examples 11 | 12 | 13 | 14 |
| Epoxy resin | Tri- or higher functional | EPICLON N695 | — | | | 100 | 100 |
| | | 157S70 | — | 100 | | | |
| | | EHPE3150 | — | | 100 | | |
| | Bifunctional | jER1007 | — | | | 200 | |
| | | jER1009F | — | | | | 200 |
| Cationic poly-merization initiator | $SbF_6^-$salt | CPI-110A | 64 | 3 | 1.5 | 10 | 10 |
| Additive | Anthracene derivative | UVS-1331 | 8634 | 3 | 0.3 | 10 | 10 |
| Solvent | | Xylene | — | | 40 | | |
| | | PGMEA | — | 150 | | 480 | 480 |
| Curability | | | | A | A | A | A |
| Adhesiveness | | | | A | A | A | A |

TABLE 3

| Photosensitive resin composition (1) | | | | | | | | | |
|---|---|---|---|---|---|---|---|---|---|
| Ingredients | | Product name | Molar extinction coefficient (365 nm) | Examples 15 | 16 | 17 | 18 | 19 | 20 |
| Epoxy resin | Tri- or higher functional | EPICLON N695 | — | 100 | 100 | 100 | 100 | 100 | 100 |
| Cationic poly-merization initiator | $B(C_6F_5)_4^-$salt | DTS-200 | 64 | 5.2 | | | | | |
| | $PF_6^-$salt | DTS-102 | 64 | | 2.6 | | | | |
| | $SbF_6^-$salt | SP-172 | 343 | | | 7.3 | | | |
| | $PF_6^-$salt | Omnicat250 | 6 | | | | 1.8 | | |
| | $B(C_6F_5)_4^-$salt | WPI-124 | 6 | | | | | 12.8 | |
| | $SbF_6^-$salt | WPI-116 | 6 | | | | | | 8.4 |
| Additive | Anthracene derivative | UVS-1331 | 8634 | 3 | 3 | 3 | 3 | 3 | 3 |
| Solvent | | PGMEA | — | 150 | 150 | 150 | 150 | 150 | 150 |
| Curability | | | | A | A | A | A | A | A |
| Adhesiveness | | | | A | A | A | A | A | A |

TABLE 4

| Photosensitive resin composition (1) | | | | | | | | | | |
|---|---|---|---|---|---|---|---|---|---|---|
| | | | Molar extinction coefficient | Examples | | | | | | |
| Ingredients | | Product name | (365 nm) | 21 | 22 | 23 | 24 | 25 | 26 | 27 |
| Epoxy resin | Tri- or higher functional | EPICLON N695 | — | 100 | 100 | 100 | 100 | 100 | 100 | 100 |
| | Bifunctional | jER1009F | — | | | | | | | |
| Cationic poly-merization initiator | $SbF_6^-$salt | CPI-110A | 64 | 3 | 3 | 3 | 3 | | | 3 |
| | $B(C_6F_5)_4^-$salt | WPI-124 | 6 | | | | | 12.8 | 12.8 | |
| Additive | Anthracene derivative | UVS-1331 | 8634 | | | | | | | 3 |
| | | SP-100 | 5323 | 4 | | | | | | |
| | Anthraquinone derivative | 2-Ethylan-thraquinone | 512 | | 37.1 | | | | | |
| | Thioxanthone derivative | Omnirad DETX | 3757 | | | 5.7 | | 5.7 | | |
| | | Omnipol TX | 5444 | | | | 11.7 | | 11.7 | |
| Sensitization aid | | UVS-2171 | 13 | | | | | | | 3 |
| Solvent | | PGMEA | — | 150 | 150 | 150 | 150 | 150 | 150 | 150 |
| Curability | | | | A | A | A | A | A | A | A |
| Adhesiveness | | | | A | A | A | A | A | A | A |

TABLE 5

| Photosensitive resin composition (1) | | | | | |
|---|---|---|---|---|---|
| | | Product | Molar extinction coefficient | Examples | |
| Ingredients | | name | (365 nm) | 28 | 29 |
| Epoxy resin | Tri- or higher functional | EPICLON N695 | | 100 | 100 |
| | Bifunctional | jER1009F | | 200 | 200 |
| Cationic polymerization initiator | $SbF_6^-$ salt | CPI-110A | 64 | 10 | 10 |
| Additive | Anthracene derivative | UVS-1331 | 8634 | 10.63 | 10.63 |
| Silane coupling agent | | A-187 | | 10.71 | 10.71 |
| Acid generator | | TPS-1000 | 0 | | 2.5 |
| Solvent | | PGMEA | | 500 | 500 |
| Curability | | | | A | A |
| Adhesiveness | | | | A | A |

TABLE 6

| Photosensitive resin composition (1) | | | | | | |
|---|---|---|---|---|---|---|
| | | | Molar extinction coefficient | Comparative Examples | | |
| Ingredients | | Product name | (365 nm) | 1 | 2 | 3 |
| Epoxy resin | Tri- or higher functional | EPICLON N695 | — | 100 | 100 | 100 |
| Cationic poly-merization initiator | $(Rf)_nPF_{6-n}$ salt | CPI-410S | 8835 | 3 | 3 | |
| | $SbF_6^-$salt | CPI-110A | 64 | | | 3 |
| Additive | Anthracene derivative | UVS-1331 | 8634 | | 3 | |
| Sensitization aid | | UVS-2171 | 13 | | | 3 |
| Solvent | | PGMEA | — | 150 | 150 | 150 |
| Curability | | | | A | A | C |
| Adhesiveness | | | | C | C | C |

TABLE 7

| Photosensitive resin composition (2) | | | |
|---|---|---|---|
| | Product | Composition | |
| Ingredients | name | 1 | 2 |
| Epoxy resin | 157S70 | 100 | |
| | EHPE3150 | | 100 |
| Cationic polymerization initiator | CPI-410S | 3 | 1 |
| Solvent | Xylene | | 40 |
| | PGMEA | 150 | |

TABLE 8

| Liquid discharge head | | | | | | |
|---|---|---|---|---|---|---|
| | Examples | | | Comparative Examples | | |
| Ingredients | 30 | 31 | 32 | 4 | 5 | 6 |
| Photosensitive resin composition (1) | Example 2 | Example 12 | Example 29 | Comparative Example 1 | Comparative Example 2 | Comparative Example 3 |
| Photosensitive resin composition (2) | 1 | 2 | 1 | 1 | 1 | 1 |
| Printed quality | B | B | A | C | C | C |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-173839, filed Oct. 25, 2021, which is hereby incorporated by reference herein in its entirety.

What is claimed is:

1. A method for producing a shaped object, the method comprising:

laminating a photosensitive resin composition on an inorganic material layer of a substrate having the inorganic material layer on a surface thereof;

performing a patterned exposure of the photosensitive resin composition using an i-line; and curing a pattern-exposed portion and removing an unexposed portion to form a shaped object in which a cured product of the photosensitive resin composition is formed on the substrate, wherein the photosensitive resin composition comprises an epoxy resin, at least one cationic polymerization initiator with a molar extinction coefficient in an i-line of less than 500 $L \cdot mol^{-1} \cdot cm^{-1}$, at least one sensitizer with a molar extinction coefficient in an i-line of 500 $L \cdot mol^{-1} \cdot cm^{-1}$ or more, and a sensitization aid.

2. The method according to claim 1, wherein the epoxy resin is a tri- or higher functional epoxy resin.

3. The method according to claim 2, wherein the epoxy resin further comprises a bifunctional epoxy resin.

4. The method according to claim 1, wherein the epoxy resin comprises at least one selected from the group consisting of an epoxy resin having an aliphatic skeleton, an epoxy resin having a bisphenol skeleton, an epoxy resin having a phenol novolac skeleton, an epoxy resin having a cresol novolac skeleton, an epoxy resin having a norbornene skeleton, an epoxy resin having a terpene skeleton, an epoxy resin having a dicyclopentadiene skeleton, and an epoxy resin having an oxycyclohexane skeleton.

5. The method according to claim 1, wherein the cationic polymerization initiator comprises at least one selected from the group consisting of a sulfonium salt compound and an iodonium salt compound.

6. The method according to claim 1, wherein the cationic polymerization initiator comprises at least one selected from the group consisting of $SbF_6^-$, $AsF_6^-$, $PF_6^-$, $(Rf)_nPF_{6-n}^-$ (Rf denotes a perfluoroalkyl group), $BF_4^-$, and $B(C_6F_5)_4^-$.

7. The method according to claim 1, wherein a content of the cationic polymerization initiator comprised in the photosensitive resin composition is 0.1 to 30.0 parts by mass in relation to 100 parts by mass of solid matters in the epoxy resin.

8. The method according to claim 1, wherein the sensitizer includes at least one selected from the group consisting of an anthracene derivative, an anthraquinone derivative, and a thioxanthone derivative.

9. The method according to claim 1, wherein a content of the sensitizer in the photosensitive resin composition is 0.1 to 30.0 parts in relation to 100 parts by mass of solid matters in the epoxy resin.

10. The method according to claim 1, wherein a content of the sensitizer in the photosensitive resin composition is 0.1 to 10 times a content of the cationic polymerization initiator on a mass basis.

11. The method according to claim 1, wherein the photosensitive resin composition further comprises a basic substance or an acid-generating agent.

12. The method according to claim 1, wherein the photosensitive resin composition further comprises a silane coupling agent.

13. The method according to claim 1, wherein the molar extinction coefficient in the i-line of the sensitizer is 5000 $L \cdot mol^{-1} \cdot cm^{-1}$ or more.

14. The method according to claim 1, wherein a content of the sensitization aid in the photosensitive resin composition is 1 to 10 parts in relation to 100 parts by mass of solid matters in the epoxy resin.

15. The method according to claim 1, wherein the sensitization aid improves an energy conversion efficiency of the sensitizer that absorbed light.

16. A method for producing a liquid discharge head comprising the method according to claim 1, wherein the liquid discharge head at least comprises a substrate having an inorganic material layer on a surface thereof, a flow path forming member disposed on the inorganic material layer of the substrate and forming a liquid flow path, and a discharge port forming member disposed on the flow path forming member and having a discharge port for discharging a liquid, and wherein the cured product of the photosensitive resin composition is the flow path forming member.

17. A liquid discharge head comprising a substrate having an inorganic material layer on a surface thereof, a flow path forming member disposed on the inorganic material layer of the substrate and forming a liquid flow path, and an discharge port forming member disposed on the flow path forming member and having an discharge port for discharging a liquid, the flow path forming member is a cured product of a photosensitive resin composition, and the photosensitive resin composition comprises an epoxy resin, at least one cationic polymerization initiator with a molar extinction coefficient in an i-line of less than 500 $L \cdot mol^{-1} \cdot cm^{-1}$, and at least one sensitizer with a molar extinction coefficient in an i-line of 500 $L \cdot mol^{-1} \cdot cm^{-1}$ or more, and a sensitization aid.

* * * * *